Feb. 24, 1953 J. I. PANTCHECHNIKOFF 2,629,802
PHOTOCELL AMPLIFIER CONSTRUCTION
Filed Dec. 7, 1951
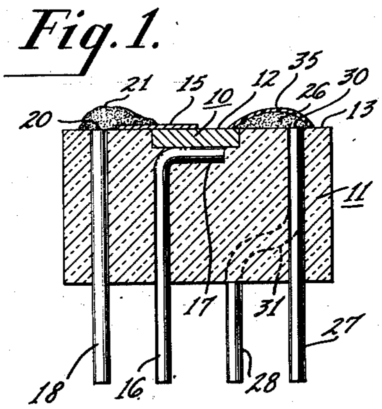
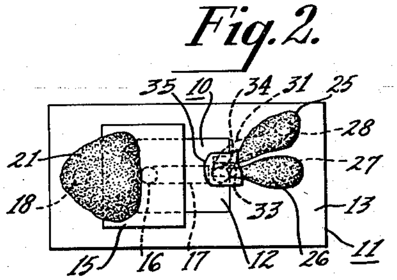
Fig. 2.
Fig. 3.
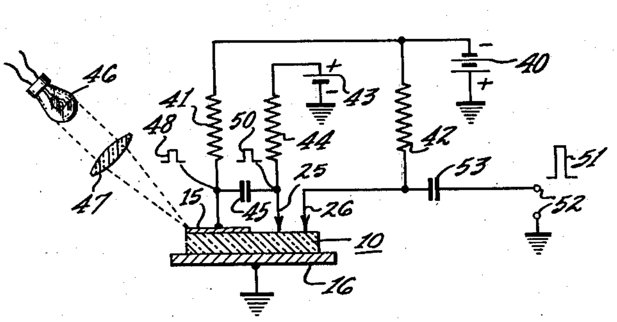
Fig. 4.
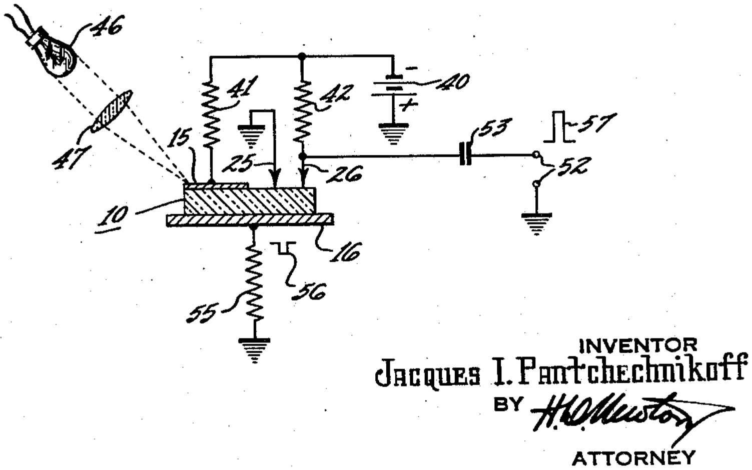
INVENTOR
Jacques I. Pantchechnikoff
BY H. O. Newton
ATTORNEY

UNITED STATES PATENT OFFICE 2,629,802

PHOTOCELL AMPLIFIER CONSTRUCTION

Jacques I. Pantchechnikoff, Princeton, N. J., assignor to Radio Corporation of America, a corporation of Delaware Application December 7, 1951, Serial No. 260,443

11 Claims. (Cl. 201—63)

This invention relates generally to photoresponsive devices, and particularly relates to an integral semi-conductor device which will develop an electrical signal in response to radiant energy and simultaneously amplify such a signal.

In a copending application of Jacques I. Pantchecknikoff, Serial No. 231,195, filed June 12, 1951, entitled "Semi-Conductor Photosensitive Device" and assigned to the assignee of this application, there has been disclosed a photosensitive device of the type comprising a semi-conducting crystal which may, for example, be germanium provided with a light-transmitting metallic film. According to the disclosure, when this metallic film consists, for example, of gold, copper or nickel, a photovoltaic device is obtained. As disclosed elsewhere, a photoconductive device may be obtained when the metallic film consists of bismuth or antimony. A photo-conductive device has a resistance which is a function of the illumination while a photovoltaic device develops into a load an output current in response to illumination. It will be understood that a photovoltaic device also has photo-conductive properties.

In accordance with the present invention, such a photo-responsive device which may either be photovoltaic or photo-conductive, is combined with a transistor of the type having rectifying electrodes. However, the usual transistor which has two point contact or rectifying electrodes, such as the type A transistor, and the photoresponsive device cannot readily be combined in a single unit. The transistor is, to a certain extent, responsive to light. Accordingly, the transistor normally should be carefully shielded from light when the photoresponsive device is illuminated. Furthermore, the usual construction of a type A resistor having a pair of point contact electrodes or cat's whiskers does not lend itself readily to a combination with a photoresponsive device of the type described.

It is accordingly an object of the present invention, to provide an improved semi-conductor photosensitive and amplifier device which is compact and sensitive, which provides for effectively shielding the amplifier section from the action of light.

Another object of the invention is to provide an improved electrode construction and shortened terminal means for a semi-conductor device of the type referred to, thereby to facilitate manufacture and to provide for any desired configuration of the electrodes.

A further object of the invention is to provide an improved photoresponsive device wherein a photocell of the type having a light-transmitting metallic film is integral with a transistor of the type having rectifying electrodes, thereby to enhance the light sentitivity characteristic of the device.

In accordance with the present invention, an integral semi-conductor photoresponsive and amplifier device is provided by embedding a semiconducting crystal in a block of insulating material so that a surface of the crystal is exposed and is substantially flush with a surface of the insulating block. A light-transmitting metallic film extends over a portion of the exposed surface of the crystal and is electrically connected to a conductor or terminal embedded in the insulating block by a coating layer which has a low electrical resistance. Preferably, the emitter and collector electrodes of the transistor are provided by a further pair of coating layers extending between another pair of conductors embedded in the insulating block and forming substantially line contacts with the crystal. The base electrode may consist of a fourth conductor embedded in the insulating block and soldered or otherwise in low-resistance contact with the crystal. Preferably, the emitter and collector electrodes consist of silver or platinum paste suspended in a volatile solvent.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is an elevational view, partly in section, of a combined semi-conductor photoresponsive and amplifier device embodying the invention;

Figure 2 is a top plan view of the device of Figure 1; and

Figures 3 and 4 are schematic circuit diagrams including the device of Figure 1 and illustrating, by way of example, effective operating circuits therefor in accordance with the invention.

Referring now to the drawing wherein like elements are designated by the same reference numerals throughout the figures and particularly to Figures 1 and 2, there is illustrated a device in accordance with the present invention comprising a crystal 10 of semi-conducting material such, for example, as germanium. The crystal 10 may, for example, consist of a thin wafer having a substantially rectangular top surface 12 as illustrated. The crystal 10 is embedded in a block 11 of insulating material which may, for example, consist of polystyrene, methacrylate or any other good insulator such as other synthetic resins, for example, gilsonite or cellulosic casting materials.

The crystal 10 preferably is embedded in such a manner that only its top surface 12 is exposed and is substantially flush with the top surface 13 of the insulating block 11. To this end, both the crystal 10 and the block 11 may be lapped or polished and thereafter the exposed surface 12 of the crystal 10 may be etched, as is conventional in the transistor art. A light-transparent film 15 of any suitable metal is now evaporated onto a portion of the exposed surface 12 of the crystal 10 such as over approximately one half of the surface 12.

The metallic film 15 may also extend over a portion of the top surface 13 of the block 11. The film 15 may consist of any suitable metal. As explained hereinbefore, if the film 15 consists of gold, copper or nickel, a photovoltaic device is obtained. On the other hand, if the film 15 consists of bismuth or antimony, a photo-conductive device is obtained. The metal film 15 should be thin enough to transmit about thirty to forty per cent of the light which is directed upon it. On the other hand, the film 15 should have a relatively low electrical resistance and it has been found that a resistivity of about 500 ohms/square area is satisfactory. The metallic film 15 may be deposited by means of the well known vacuum evaporation technique. The operation and performance of a photovoltaic device having a gold, nickel or copper film has been described in the copending application above referred to.

The photoresponsive device is completed by means of a low-resistance electrode. To this end, a conductor 16 such as a wire of an electrically conducting metal may be embeded in the block 11. The wire 16 may have a bent portion 17 which may be soldered, for example, to the lower surface of the crystal 10 to provide a low-resistance contact therewith.

The terminal for the metallic film 15 includes a conductor 18 which is also embedded in the block 11 and which may also consist of a metal which is a good conductor of electricity. The conductor 18 has an exposed surface 20 which is also substantially flush with the top surface 13 of the block 11. A conducting connection between the metallic film 15 and the conductor 18 is effected by a coating layer 21 which extends between the film 15 and the exposed surface 20 of the conductor 18. This coating layer 21 may be formed of a thin layer of a metallic paste such as silver or platinum paste suspended in a volatile solvent. However, a colloidal suspension of any other conducting material may be substituted for the silver or platinum paste as long as a coating layer is produced having relatively low electrical resistance. Thus, a low-resistance path is provided between the film 15 and the conductor 18.

In accordance with the present invention the photoresponsive device is integral with a transistor of the type having rectifying electrodes. The conductor 16 forms the base electrode of the transistor being in low-resistance contact with the crystal 10. The emitter and collector electrodes are formed by a pair of coating layers 25 and 26 which may consist of the same material as the layer 21 and preferably consist of silver or platinum paste. The coating layers 25, 26 are in rectifying contact with the crystal 10. The coating layers 25 and 26 are in contact with another pair of conductors 27 and 28 embedded in the block 11 and each having an exposed surface such as the surface 30 flush with the top surface 13 of the block 11. The conductor 27 extends straight through the block 11. The conductor 28 has an end or terminal portion which is preferably arranged in a straight line with the free end portions of the conductors 16, 18 and 27. The conductor 28 has a bent intermediate portion 31 so that its exposed surface is spaced from that of the conductor 27.

The conducting layers 25 and 26 extend between the exposed surfaces of the conductors 27, 28 and the exposed surface 12 of the crystal 10 and may easily be applied by a fine point brush. They form substantially straight edges 33 and 34 which extend over the exposed surface 12 of the crystal 10 and which are preferably spaced from each other a distance of the order of a few mils. The coating layers 25 and 26 should be sufficiently spaced from the metallic film 15 so as to prevent interaction between the photoresponsive device and the transistor device.

In accordance with the present invention, the area in the immediate vicinity of the coating layers 25, 26, which represent the emitter and collector is preferably coated with a layer 35 of an opaque material such, for example, as Picein wax dissolved in benzene. This will shield the transistor or transistor section from light which is directed against the metallic film 15. The four conductors 16, 18, 27 and 28 which are preferably disposed substantially in a straight line may be spaced in such a manner that they will fit a socket for a subminiature tube.

Since the metallic paste of which the coating layers 25, 26 consist cannot be electrically formed, the transistor may be formed by using a pair of removable point electrodes between which an electrical charge is impressed in the usual manner. If desired, the point electrodes may be moved so as to form or treat an extended area of the exposed surface 12 of the crystal 10.

The photoresponsive device is primarily sensitive to visible and infra-red light which may have a wave length of approximately two microns or less.

Figure 3 illustrates, by way of example, an electric circuit for operating the device illustrated in Figures 1 and 2. The circuit of Figure 3 may be considered a grounded base transistor having emitter input and collector output. Accordingly, the base 16 is grounded as shown. A suitable source of voltage such as a battery 40 has its positive terminal grounded, while its negative terminal is connected to the film 15 through a resistor 41. The film 15 is accordingly negative with respect to the base 16. The collector 26 is connected to the negative terminal of the battery 40 through an output resistor 42. Another source of voltage such as a battery 43 has its negative terminal grounded while its positive terminal is connected to the emitter 25 through a resistor 44 thereby maintaining the emitter at a positive potential with respect to the base 16. A coupling capacitor 45 couples the film 15 to the emitter 25.

The circuit of Figure 3 operates in the following manner: Light developed by a light source 46 which may contain infra-red or visible light is directed, for example, by a lens 47 toward the film 15. In response to a short pulse of light, the electric resistance between the film 15 and the base 16 is reduced so that a larger current flows through the resistor 41. Accordingly, the potential of the film 15 is momentarily raised as indicated by the pulse 48. This positive pulse is impressed through the coupling capacitor 45 on the emitter 25 where it appears as a positive pulse 50. This positive pulse is then amplified by the transistor, and an amplified positive pulse 51 appears at the collector and may be obtained from the output terminals 52, one of which is grounded while the other is coupled to the collector 26 through a coupling capacitor 53.

Instead of coupling the film 15 to the emitter 25, it is also feasible to provide a grounded emitter transistor amplifier which is coupled to the photoresponsive device through a base coupling impedance element. Such a circuit is illustrated in Figure 4 to which reference is now made. The emitter 25 is grounded as shown, while the base 16 is grounded through a coupling resistor 55. When a pulse of light from the source 46 is directed upon the film 15, a larger current flows between the film 15 and the base 16 so that a negative pulse shown at 56 is developed across the base resistor 55. This pulse is again amplified by the transistor and a positive and amplified output pulse 57 is developed at the collector 26 which may be obtained from the output terminals 52.

The polarities of the batteries 40 and 43 of Figures 3 and 4 are poled to provide the correct voltages for an N type crystal 10. If the crystal 10 should be of the P type, the polarities of the batteries should be reversed. In Figure 4 bias battery 43 may be omitted because due to the provision of the base resistor 55, the base 16 will be negative with respect to the emitter 25 thereby providing the required bias between emitter and base.

A voltage of approximately —5 volts should be applied to the film 15. The transistor section has been found to have a gain of 14 db with an emitter current of 0.6 milliamperes and a collector voltage of —5.5 volts. The input impedance was found to be 200 ohms as was the output impedance.

There has thus been disclosed an improved integral photoresponsive and amplifier device. The device of the invention is compact; it has short electrode terminals or leads, is easy to manufacture, stable and of small size. The emitter and collector electrode may easily be protected against the action of light and consist of a conducting coating layer that may assume any desired configuration.

What is claimed is:

1. An integral semi-conductor photoresponsive and amplifier device comprising a semi-conducting body, insulating means for embedding said body with at least one surface exposed, a light transmitting metallic film extending over and contacting a portion of said exposed surface, means providing a first, a second and a third conductor, a first coating layer for said insulating means interconnecting said film with said first conductor, a second coating layer for said insulating means extending between said second conductor and said exposed surface, a third coating layer for said insulating means extending between said third conductor and said exposed surface, said coating layers consisting of low-resistance material, and said second and third coating layers being spaced from said film and having substantially straight closely adjacent edges extending over a portion of said exposed surface.

2. An integral semi-conductor photoresponsive and amplifier device comprising a semi-conducting body, a block of insulating material within which said body is embedded so that a surface of said body is exposed and is substantially flush with a surface of said block, a light transmitting film of metal extending over and contacting a portion of said exposed surface, a first, a second and a third conductor embedded in said block and spaced from said crystal, each of said conductors having an exposed surface substantially flush with said surface of said block, a first coating layer interconnecting said film with said first conductor, a second coating layer extending between the exposed surface of said second conductor and the exposed surface of said body, a third coating layer extending between the exposed surface of said third conductor and the exposed surface of said body, said coating layers consisting of low-resistance material, and said second and third coating layers being spaced from said film and having substantially straight closely adjacent edges extending over a portion of the exposed surface of said body.

3. A device as defined in claim 2 wherein said second and third coating layers consist of a metallic paste.

4. An integral semi-conductor photoresponsive and amplifier device comprising a semi-conducting body, a block of insulating material within which said body is embedded so that a surface of said body is exposed and is substantially flush with a surface of said block, a light transmitting film of metal extending over and contacting a portion of said exposed surface, a first, a second and a third conductor embedded in said block and spaced from said crystal, each of said conductors having an exposed surface substantially flush with said surface of said block, a first coating layer of low-resistance material interconnecting said film with said first conductor, a second coating layer of a metallic paste extending between the exposed surface of said second conductor and the exposed surface of said body, a third coating layer of a metallic paste extending between the exposed surface of said third conductor and the exposed surface of said body, said second and third coating layers being spaced from said film and having substantially straight closely adjacent edges extending over a portion of the exposed surface of said body, and a fourth conductor embedded in said block and in low-resistance contact with said body.

5. A device as defined in claim 4 wherein said metallic paste is composed substantially of silver.

6. A device as defined in claim 4 wherein said metallic paste is composed substantially of platinum.

7. A device as defined in claim 4 wherein said conductors extend away from said block and are disposed substantially in a straight line.

8. A device as defined in claim 4 wherein said film consists of a metal selected from the group consisting of gold, copper and nickel, thereby to provide a photoresponsive device which is photovoltaic.

9. A device as defined in claim 4 wherein said film consists of a metal selected from the group consisting of bismuth and antimony, thereby to provide a photoresponsive device which is photoconductive.

10. An integral semi-conductor photoresponsive and amplifier device comprising a semi-conducting body, a block of insulating material within which said body is embedded so that a surface of said body is exposed and is substantially flush with a surface of said block, a light transmitting film of metal extending over and contacting a predetermined portion of said exposed surface, a first, a second and a third conductor embedded in said block and spaced from said crystal, each of said conductors having an exposed surface substantially flush with said surface of said block, a first coating layer interconnecting said film with said first conductor, a second coating layer extending between the exposed surface of said second conductor and the exposed surface of said body, a third coating layer extending between the exposed surface of said third conductor and the exposed surface of said body, said coating layers consisting of a metallic paste, said second and third coating layers being spaced from said film and having substantially straight closely adjacent edges extending over a portion of the exposed surface of said body, a fourth conductor embedded in said block and in low-resistance contact with said body, and a further coating layer of an opaque material covering said second and third coating layers and the area in their immediate vicinity.

11. A semi-conductor device comprising a semiconducting body, a block of insulating material within which said body is embedded, said body having an exposed surface substantially flush with a surface of said block, a first and a second conductor embedded in said block and spaced from said crystal, each of said conductors having an exposed surface substantially flush with said surface of said block, a first coating layer of a metallic paste extending between the exposed surface of said first conductor and the exposed surface of said body, a second coating layer of a metallic paste extending between the exposed surface of said second conductor and the exposed surface of said body, said coating layers having substantially straight closely adjacent edges extending across the exposed surface of said body, and a third conductor embedded in said block and in low-resistance contact with said body.

JACQUES I. PANTCHECHNIKOFF.

REFERENCES CITED

The following references are of record in the file of this patent:

UNITED STATES PATENTS

| Number | Name | Date |
|---|---|---|
| 1,765,607 | Ohl | June 24, 1930 |
| 2,161,600 | Van Geel | June 6, 1939 |
| 2,560,594 | Pearson | July 17, 1951 |